United States Patent [19]
Shiono et al.

[11] Patent Number: 5,390,191
[45] Date of Patent: Feb. 14, 1995

[54] APPARATUS AND METHOD FOR TESTING THE INTERCONNECTION BETWEEN INTEGRATED CIRCUITS

[75] Inventors: Toru Shiono; Toshitaka Senuma, both of Tokyo; Katsumi Matsuno, Kanagawa; Tokuya Fukuda, Tokyo, all of Japan

[73] Assignee: Sony Corporation, Tokyo, Japan

[21] Appl. No.: 6,760

[22] Filed: Jan. 21, 1993

[30] Foreign Application Priority Data

Jan. 31, 1992 [JP] Japan .................................. 4-042288
May 28, 1992 [JP] Japan .................................. 4-160006

[51] Int. Cl.$^6$ .................................................. G01R 31/28
[52] U.S. Cl. ........................................ 371/22.3; 371/25.1
[58] Field of Search .................. 371/22.1, 22.3, 24, 371/25.1, 20.4

[56] References Cited

U.S. PATENT DOCUMENTS

| | | | |
|---|---|---|---|
| 4,435,806 | 3/2984 | Segers et al. .................. | 371/25 |
| 4,713,702 | 12/1987 | Ishihara et al. . | |
| 4,791,358 | 12/1988 | Sauerwald et al. .............. | 324/73 R |
| 4,879,717 | 11/1989 | Sauerwald et al. .............. | 371/22.3 |
| 5,056,093 | 10/1991 | Wh et al. ....................... | 371/22.3 |
| 5,161,160 | 11/1992 | Yaguchi et al. .................. | 371/22.3 |

OTHER PUBLICATIONS

IEEE Standard Test Access Port And Boundary-Scan Architecture, Published by the Institute of Electrical and Electronics Engineers, Inc., 345 East 47th St., New York, N.Y. 10017, USA, May 21, 1990.

*Primary Examiner*—Robert W. Beausoliel, Jr.
*Assistant Examiner*—Norman M. Wright
*Attorney, Agent, or Firm*—William S. Frommer; Alvin Sinderbrand

[57] ABSTRACT

An integrated circuit for boundary scan is achieved to be simple structure. A testing apparatus 6 provides a testing data to a serial input port SI of a integrated circuit IC1 via a external terminal unit 2. The testing data is output to a parallel input port PI of the integrated circuit IC2 from a parallel output port SO of the integrated circuit IC1, then the testing data is output from the serial output port SO. The testing apparatus 6 compares with the testing data outputted to the integrated circuit IC1 and the testing data outputted from the integrated circuit IC2 so that a state of connection is detected between the parallel output port PO of the integrated circuit IC1 and the parallel input port PI of the integrated circuit IC2. The construction of the integrated circuits can be simplified by using both of inputting and outputting of the serial interface SIF.

20 Claims, 8 Drawing Sheets

APPARATUS AND METHOD FOR TESTING THE INTERCONNECTION BETWEEN INTEGRATED CIRCUITS

FIELD OF THE INVENTION

This invention relates to a testing apparatus for integrated circuit system and testing method thereof, and more particularly to an improvement of testing a state of connection between plural integrated circuits connected to each other on a circuit board.

BACKGROUND OF THE INVENTION

Figure 1:
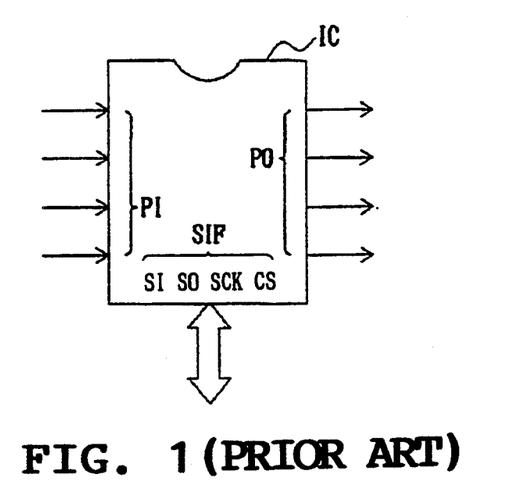
FIG. 1 is a schematic view showing structure of an integrated circuit.

In conventional integrated circuits, as shown in FIG. 1, there are provided a parallel data input port PI and a parallel output port PO, and further provided a serial interface SIF for performing serial communication with a microcomputer or other integrated circuits. In this serial interface SIF, there are provided a serial input terminal SI for data, a serial output terminal SO for data, a clock terminal SCK for communication, and a chip selection terminal CS for selecting a chip to communicate with.

In practice, an integrated circuit has some terminals used for both inputting and outputting data. Therefore, input terminals, output terminals, and terminals for both inputting and outputting data should be called an input/output port as a whole. However, in this specification, the terms of input port and output port are used for simplicity. Furthermore, a parallel input port PI and parallel output port PO are not always arranged in such a regular form, besides some integrated circuits do not have a parallel input port. However, arrangement in regular form is used in Figures for simplicity.

Figure 2:
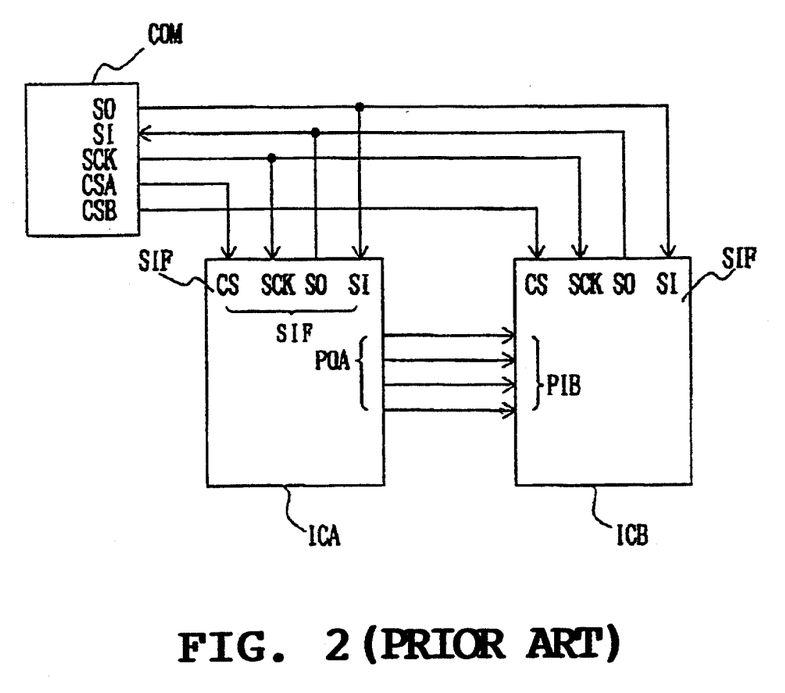
FIG. 2 is a connection diagram showing a connection state between a microcomputer and a plurality of integrated circuits.

To connect a plurality of integrated circuits having such structure shown in FIG. 2, a parallel output port POA of a first integrated circuit ICA is connected to a parallel input port PIB of a second integrated circuit ICB, and furthermore, corresponding a serial input terminal SI, a serial output terminal SO and a clock terminal SCK of a microcomputer 9 are connected to integrated circuits ICA and ICB in common. Each chip selection terminals CS of integrated circuits ICA and ICB is individually connected to a microcomputer 9 for control, so that time sharing communication with a chip selected by the chip selection terminal CS is performed.

To perform data transmission or reception between these connected integrated circuits, it is required to test whether or not every parallel input port PI and parallel output port PO of all integrated circuits are surely connected. As integrated circuits are mounted at higher density on a limited area of circuit board, difficulty becomes more serious in surely testing a state of connection due to more complicated connection.

Figure 3:
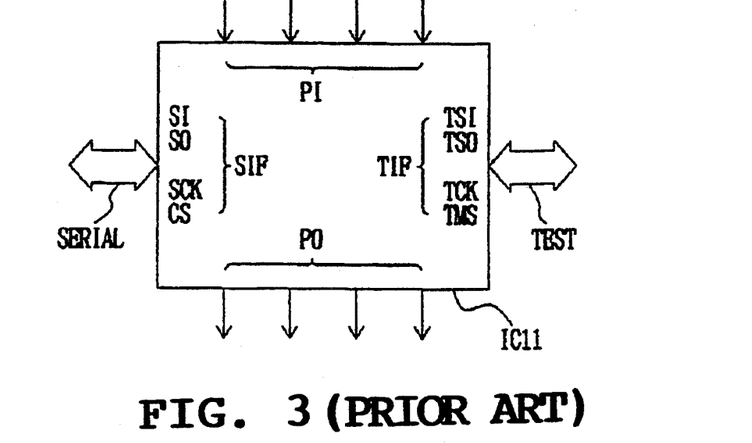
FIG. 3 is a schematic view of an integrated circuit used for a conventional B/S method.

One of the methods proposed to solve the above problems is a testing method called boundary scan (hereafter referred to simply as B/S) method (IEEE Std, 1149.1-1990, issue May 21, 1990). In this method, as shown in FIG. 3, this type of integrated circuit IC11 has a testing interface TIF for B/S in addition to a parallel data input port PI, a parallel output port PO, and a serial interface SIF for serial communication. Provided that same as drawings in prior art shall not apply to designation symbols of application drawings in the present invention.

This testing interface TIF comprises a testing serial input terminal TSI for inputting testing data in serial form from the outside, a testing serial output terminal TSO for outputting the input testing data in serial form, a testing clock input terminal TCK for inputting a clock signal for use in processing of the testing data, and a testing mode selection terminal TMS for inputting a command which sets the integrated circuit IC11 to a testing mode.

Figure 4:
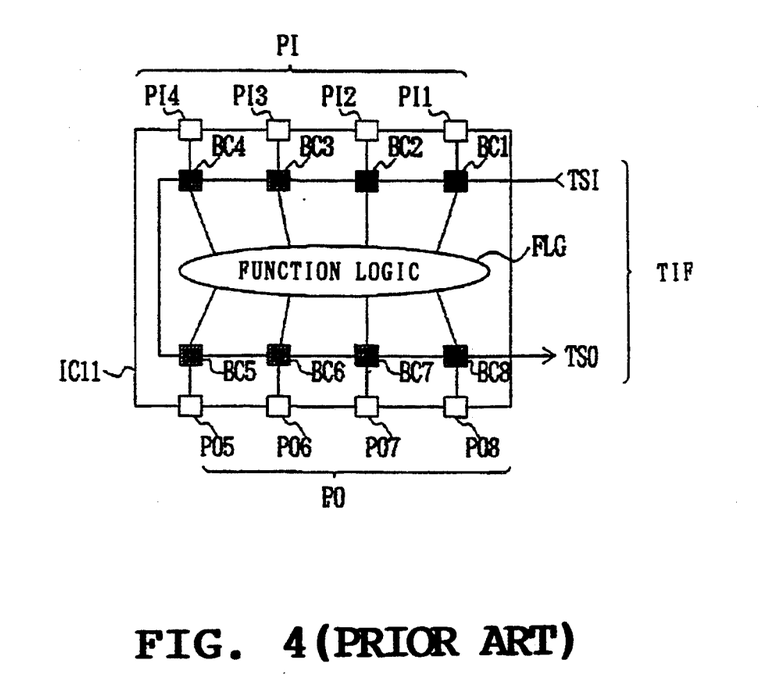
FIG. 4 is a schematic view showing internal structure of an integrated circuit used for a conventional B/S method.

As shown in FIG. 4, in this integrated circuit IC11, between the parallel input port PI and a function logic circuit FLG for performing predetermined data processing, there are provided boundary-scan cells (shortened form of B/S cell) BC1 to BC4 which correspond respectively to input terminals PI1 to PI4 of the parallel input port PI. This integrated circuit has an input/output port in a 4-bit form. The parallel input port PI consists of four input terminals PI1 to PI4. Each of these input terminals PI1 to PI4 is individually connected to each of B/S cells BC1 to BC4.

Furthermore, between the parallel output port PO and the function logic circuit FLG for performing predetermined data processing, there are provided B/S cells BC 5 to BC8 which correspond respectively to output terminals PO5 to PO8 of the parallel output port PO.

Each of B/S cells BC1 to BC8 has a switching circuit and a latch circuit so that it inputs and holds data, and transfers the data on the basis of a clock. Other features of structure of B/S cells are disclosed in the literature described above.

For simplicity, the testing clock input terminal TCK and the testing mode selection terminal TMS are not shown in FIG. 4.

The integrated circuit IC11 having the structure described above performs operation comprising steps of:

(1) transferring 4-bit serial data, being input into the testing signal input terminal TSI, to B/S cells BC5 to BC8 via B/S cells BC1 to BC4, then outputting the data from the testing serial output terminal TSO;

(2) storing temporarily 4-bit data, being input in parallel form from the input terminals PI1 to PI4, in B/S cells BC1 to BC4, then transferring the stored data to B/S cells BC5 to BC8, furthermore outputting the data in serial form via the testing serial output terminal TSO; and (3) transferring 4-bit serial data, input into the testing serial input terminal TSI, to B/S cells BC5 to BC8 via B/S cells BC1 to BC4, then outputting the data in parallel form from the corresponding output terminals PO5 to PO8.

Figure 5:
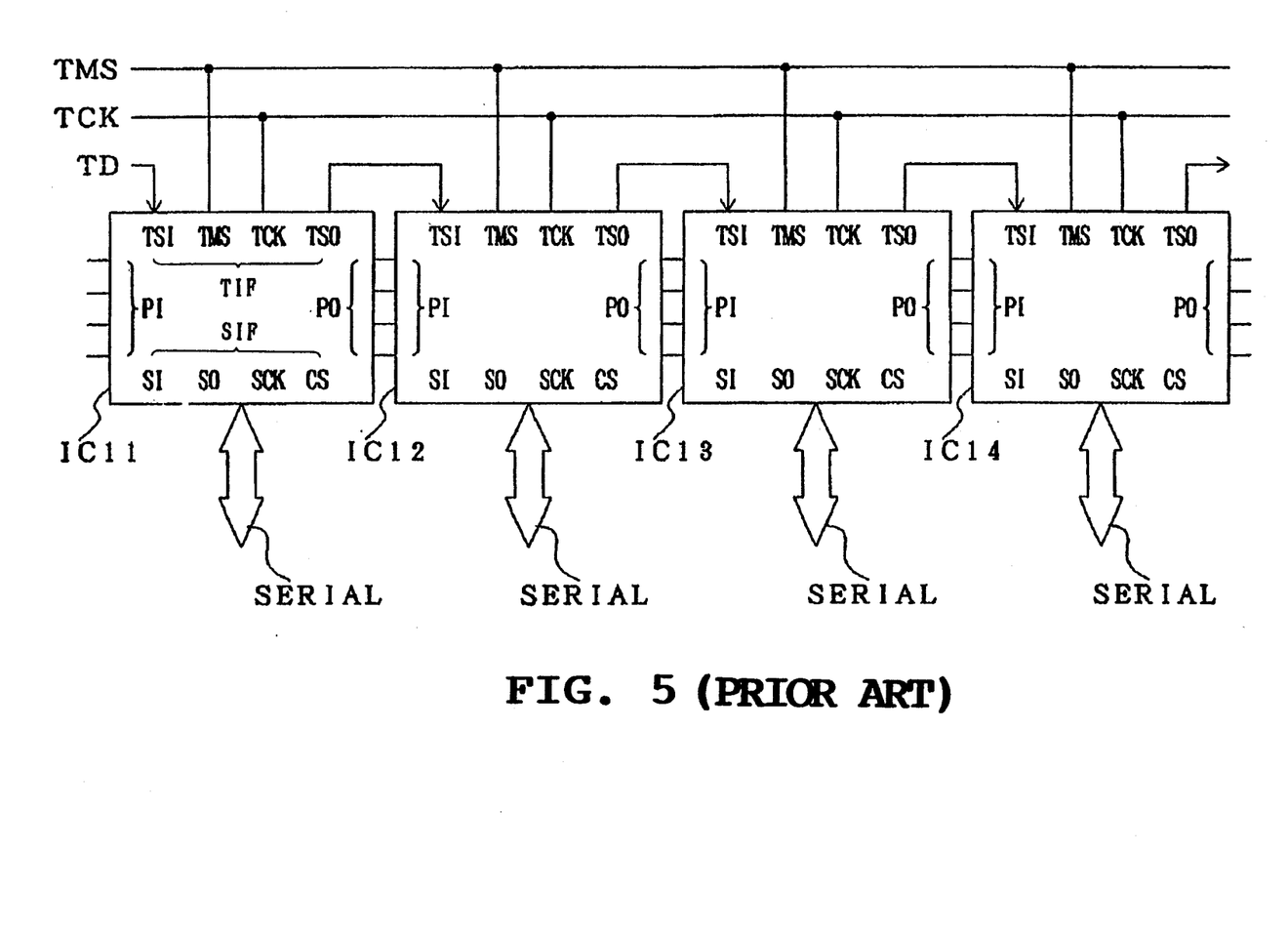
FIG. 5 is a diagram for explanation of a conventional B/S method.

The integrated circuit IC11 having a testing interface TIF and B/S cells BC1 to BC8, and integrated circuits IC12, IC13 and IC14 having similar structure are connected in such a manner shown in FIG. 5. 4-bit serial testing data TD is input into the testing serial input terminal TSI of the first integrated circuit IC11. This input testing data TD is transferred to the B/S cells BC5 to BC8 via the B/S cells BC1 to BC4 shown in FIG. 4, and then is output to the parallel input port PI of the second integrated circuit IC12.

The testing data TD, input into the parallel input port PI of the second integrated circuit IC12, is stored in B/S cells (similar to the B/S cells BC1 to BC4 in FIG. 4) provided to correspond to the parallel input port PI of the second integrated circuit IC12, and then it is transferred to the B/S cells (similar to the B/S cells BC5 to BC8 in FIG. 4) corresponding to the parallel output PO of the second integrated circuit IC12, and finally it is output from the testing serial output terminal TSO. Similarly, after that, in integrated circuits IC13 and IC14, the testing data is input and output via testing serial input terminals TS1 and via testing serial output terminals TSO of these integrated circuits.

In this way, testing data TD is outputted via the parallel output port PI of the integrated circuit IC11 and via the parallel input port PO of the integrated circuit IC12. When "1111" is input, for example, as testing data TD, if there exists any disconnection or defective connection in any of parallel signal lines between the parallel output port PO of the integrated circuit IC11 and the parallel input port PI of the integrated circuit IC12, just portions of the data corresponding to the failure become "0" in the serial data output from the testing serial output terminal TSO of the second integrated circuit IC12. Thus, for example, "1011" or such a kind of data will be output.

Therefore, a state of connection between the first integrated circuit IC11 and the second integrated circuit IC12 can be tested based on the above output data.

For simplicity of explanation, a case in which connection is made in regular form is described here, while the integrated circuit IC11, in practice, might be also connected to the integrated circuit IC13, or the output of the integrated circuit IC12 might be input into the integrated circuit IC11.

However, the testing interface TIF, which is provided in the above integrated circuit for inputting or outputting testing data, leads to complexity in the structure.

SUMMARY OF THE INVENTION

In view of the foregoing, an object of this invention is to provide a simpler-structure integrated circuit testing apparatus and testing method thereof capable of testing a state of connection between each integrated circuit.

The foregoing objects and other objects of the invention have been achieved by the provision of the integrated circuit testing apparatus comprising a first integrated circuit IC1 and a second integrated circuit IC2 each of which comprises data input/output ports PI and PO for at least inputting or outputting predetermined data, a serial input terminal SI and a serial output terminal SO for serial communication, a clock terminal SCK, and a chip selection terminal CS, the data being transmitted or received from or to the data input/output port PO of the first integrated circuit IC1 to or from the corresponding input/output port PI of the second integrated circuit IC2, each of the first and second integrated circuits further comprising:

a testing mode selection terminal TMS for setting the first and second integrated circuits IC1 and IC2 to a testing mode; and boundary scan cells BC1 to BC8 provided in each of the first and second integrated circuits in such a way that the boundary scan cells correspond to the data input/output port PI and PO of the first or second integrated circuits, respectively;

whereby a state of connection between the first and second integrated circuits is tested in a testing mode by:

inputting predetermined testing data into the boundary scan cells BC5 to BC8 of the first integrated circuit IC1 via the serial input terminal SI of the first integrated circuit IC1;

reading the testing data, input into the data input/output port PO of the first integrated circuit IC1, from the boundary scan cells BC1 to BC4 provided to correspond to the data input/output port PI of the second integrated circuit IC2.

The present invention also provides a method for testing integrated circuit apparatus comprising a first integrated circuit IC1 and a second integrated circuit IC2 each of which comprises data input/output ports PI and PO for at least inputting or outputting predetermined data, a serial input terminal SI and a serial output terminal SO for serial communication, a clock terminal SCK, and a chip selection terminal CS, the data being transmitted or received from or to the data input/output port PO of the first integrated circuit IC1 to or from corresponding the input/output port PI of the second integrated circuit IC2, each of the first and second integrated circuits IC1 and IC2 further comprising:

a testing mode selection terminal TMS for setting the first and second integrated circuits IC1 and IC2 to a testing mode; and boundary scan cells BC1 to BC8 provided in the each of the first and second integrated circuits IC1 and IC2 in such a way that the boundary scan cells BC1 to BC8 correspond to the data input/output ports PI and PO of the first or second integrated circuits IC1 and IC2, respectively;

the method comprising the steps of:

inputting predetermined testing data into the boundary scan cells BC5 to BC8 of the first integrated circuit IC1 via the serial input/output terminal PO of the first integrated circuit IC1;

transferring the testing data from the data input/output port PO of the first integrated circuit IC1 to the data input/output port PI of the second integrated circuit IC2; and reading the testing data from the boundary scan cells BC1 to BC4 provided to correspond to the data input/output port PI of the second integrated circuit IC2.

In the testing operation of the integrated circuit apparatus having the above aspects, serial interfaces SIF (SI, SO, SCK, CS) of the first and second integrated circuits IC1 and IC2 are not only used for performing serial communication but also used for inputting or outputting testing data. Thus, the interface TIF for inputting or outputting testing data other than the test mode select terminal (TMS) can be omitted and structure becomes simpler.

In accordance with the present invention, simple structure of an integrated circuit apparatus can be achieved, wherein testing of a state of connection between integrated circuits is carried out by using serial input/output terminals of the integrated circuits also as a testing input/output terminals for inputting or outputting testing data.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 6:
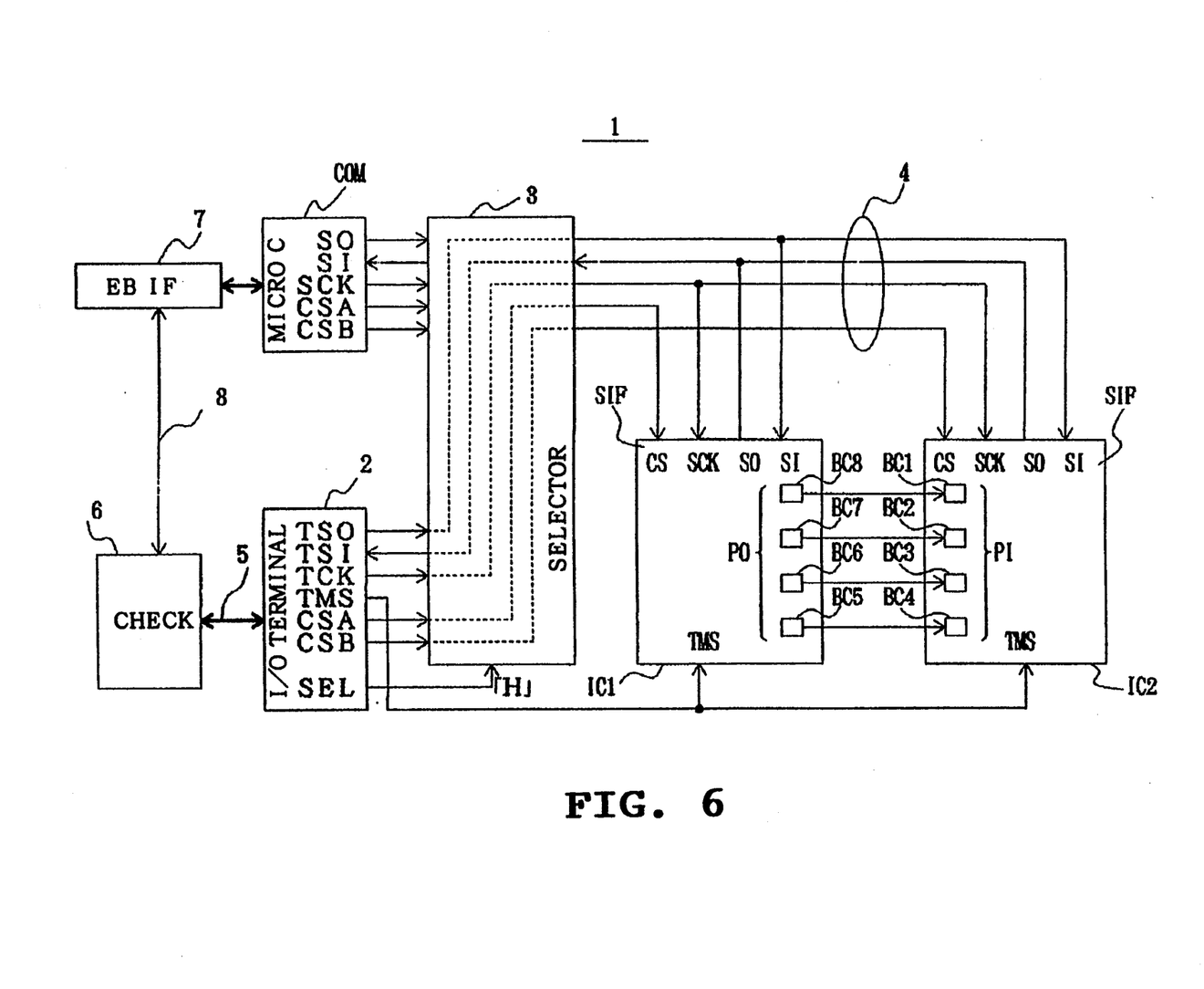
FIG. 6 is a block diagram showing structure of a testing apparatus of an integrated circuit apparatus according to an embodiment of the present invention.

Preferred embodiments of this invention will be described with reference to the accompanying drawings:

FIG. 6 is a block diagram showing structure of a testing system of an integrated circuit apparatus according an embodiment of the present invention. In this FIG. 6, elements are denoted by the same reference numerals and characters as those of corresponding elements of FIGS. 3 and 4.

An integrated circuit apparatus 1 comprises two integrated circuits IC1 and IC2 mounted on one circuit board, wherein a parallel output port PO of the integrated circuit IC1 and a parallel input port PI of the integrated circuit IC2 is connected to each other so that data is transmitted or received to or from these two integrated circuits IC1 and IC2. Each of a serial interface SIF of the integrated circuits IC1 and IC2, is connected to a microcomputer 9 via a selector 3 and an internal communication bus 4, performing serial communication among the microcomputer 9 and the integrated circuits IC1 and IC2.

In the integrated circuit apparatus 1 having structure described above, a selector 3 is connected to an external I/O terminal unit 2 so that when a selection terminal SEL of this selector 3 is set to "H" level, the selector 3 is switched in connection from a microcomputer 9 to the external I/O terminal unit 2 as shown by broken lines in FIG. 6.

A checking apparatus 6 is also connected to the external I/O terminal unit 2 via a first bidirectional communication bus 5 so that the checking apparatus 6 transmits various control data to the external I/O terminal unit 2 and so that the checking apparatus 6 directly transmits or receives testing data to or from an internal communication bus 4 of the integrated circuit apparatus 1 via the external I/O terminal unit 2.

The microcomputer 9 is connected to an external bus interface 7. The external bus interface 7 is also connected to the checking apparatus 6 via an external communication bus 8. The external communication bus 8 is used for the checking apparatus 6 to let the microcomputer 9 know that starting of a test is required, while it is used in conventional testing methods for data communication for remote control of the integrated circuit apparatus 1 and for setting of modes or parameters of the integrated circuits IC1 and IC2. Examples of the external bus interface 7 and the external communication bus 8 are a LANC (Local Application Control Bus System: registered trademark) proposed by the applicant of the present invention. The LANC is disclosed in detail, for example, in U.S. patent application Ser. No. 4,713,702 also proposed by the applicant of the present invention.

Referring to FIG. 6, when the checking apparatus 6 sets the selection terminal SEL of the external I/O terminal unit 2 to "H" level, the selector 3 is switched in connection from the microcomputer 9 to the external I/O terminal unit 2 as shown by broken lines. In this state, a testing serial output terminal TSO, a testing serial input terminal TSI, and a testing clock terminal TCK of the external I/O terminal unit 2 are connected to serial input terminals SI and serial output terminals SO, and clock input terminals SCK, respectively, in the serial interfaces SIF of both integrated circuits IC1 and IC2.

Furthermore, in this state, a chip selection terminal CSA of the external I/O terminal unit 2 is connected to a chip selection terminal CS of the integrated circuit IC1, and a chip selection terminal CSB of the external I/O terminal unit 2 is connected to a chip selection terminal CS of the integrated circuit IC2. By using these two chip selection terminals CSA and CSB, the integrated circuits IC1 and IC2 are operated individually so that data is not output at the same time, on the internal communication bus 4 connected to the serial interfaces SIF, from both the serial output terminals SO of the integrated circuits IC1 and IC2.

A testing mode selection terminal TMS of the external I/O terminal unit 2 is connected to testing mode selection terminals TMS of both of integrated circuits IC1 and IC2 so that the integrated circuit IC1 or IC2 can be set to a testing mode depending on a logic level of the testing mode selection terminals TMS.

Figure 7:
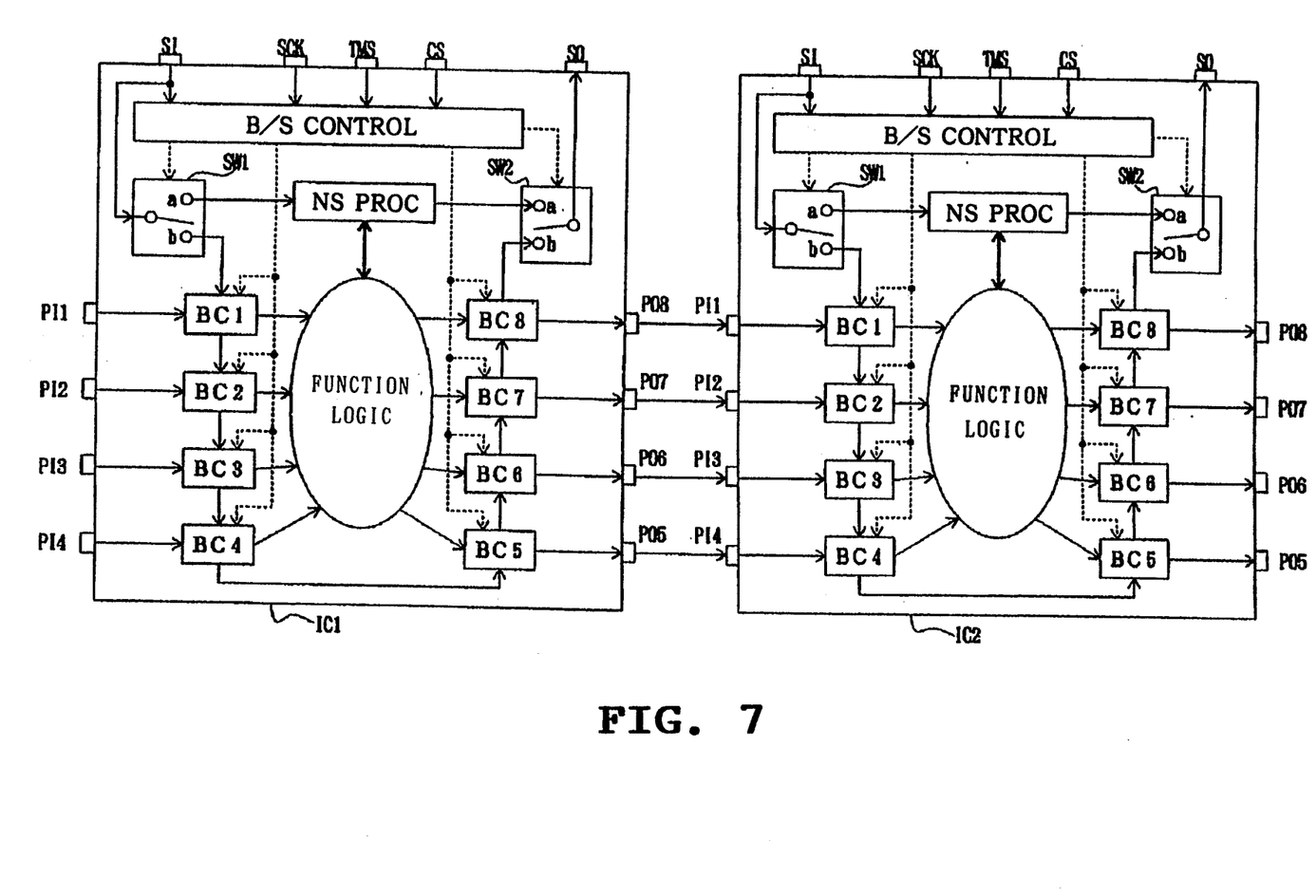
FIG. 7 is a block diagram showing internal structure of an integrated circuit according to an embodiment of the present invention.

FIG. 7 is a block diagram showing internal structure of an integrated circuit according to the present embodiment of this invention.

The testing interface TIF, which is provided in the conventional integrated circuit shown in FIG. 3, is omitted in the integrated circuits IC1 and IC2. Instead of the testing interface TIF, testing data is input via the serial interface SIF. Provided that the TMS terminal is located. Thus, a B/S control circuit switches switching circuits SW1 and SW2 depending on the logic level of the testing mode selection terminal TMS so that data from the serial interface SIF is applied to a normal signal processing circuit in the normal operation mode and data from the serial interface SIF is applied to B/S cells BC1 to BC8 in the testing mode. The normal signal processing circuit, without explanation in detail, comprises a plurality of registers for performing data processing, for example setting of modes or parameters of the integrated circuits IC1 and IC2, in the normal mode.

Figure 8:
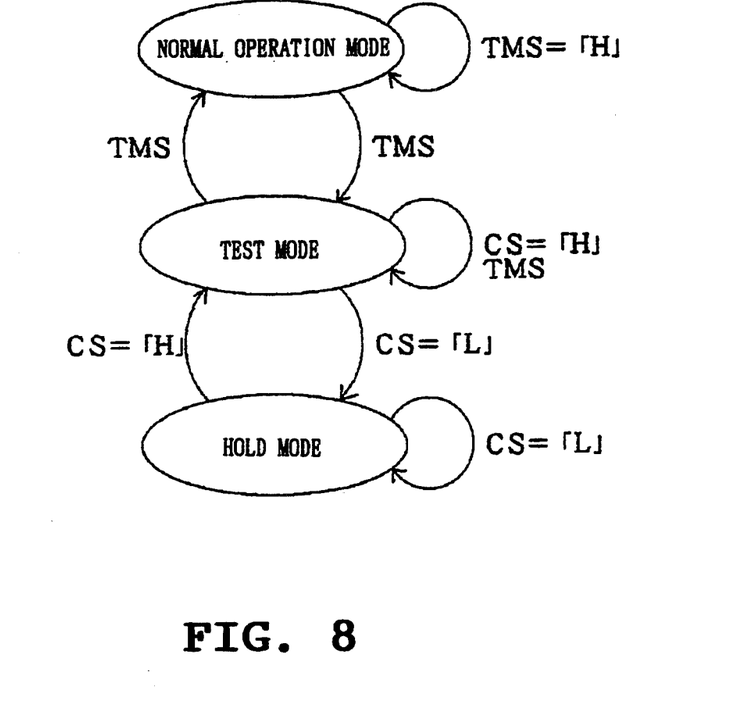
FIG. 8 is a state transition diagram of an integrated circuit according to an embodiment of the present invention.

The change of mode of the integrated circuits IC1 and IC2 is shown in the state transition diagram of FIG. 8. As shown there, the normal operation mode is altered to the testing mode by setting the testing mode selection terminal TMS to "H" level. In this state, when the chip selection terminal CS is set to "L" level, a corresponding integrated circuit can be altered to a holding mode. In this holding mode, states of the integrated circuits do not change, and the parallel input terminal PI and the output terminal PO maintain their previous states.

Referring to FIGS. 6 to 8, operation of the testing apparatus of the integrated circuit apparatus according to the present embodiment of this invention will be described below.

First, the checking apparatus 6 sets the microcomputer 9 to a B/S mode via the external communication bus 8 and the external bus interface 7. When the microcomputer 9 is set to the B/S mode, it stops any operation in the normal mode. Noted that the microcomputer 9 is provided for performing primary computing process of the integrated circuits IC1 and IC2.

Then, the checking apparatus 6 sets the selection terminal SEL of the external I/O terminal unit 2 to "H" level so as to connect each terminal of the external I/O terminal unit 2 to the serial interfaces SIF of both integrated circuits IC1 and IC2. At the same time, the microcomputer 9 is disconnected from the integrated circuits IC1 and IC2.

In this state, when the chip selection terminal CSA of the external I/O terminal unit 2 is set to "H" level, the integrated circuit IC1 is selected. Furthermore, the integrated circuit IC1 is altered to the testing mode by setting the testing mode selection terminal TMS to "H" level.

Now, a command (EXTEST) obtained from the checking apparatus 6, for inputting testing data, is input into the serial input terminal SI of the integrated circuit IC1 in the testing mode via the external I/O terminal unit 2, than data of "00001111" is input into the serial input terminal SI of the integrated circuit IC1 so as to set the parallel output port PO to "0000" as 4-bit testing data. This data of "00001111" is then transferred to BC1 to BC8 based on a clock signal input into the clock terminal SCK. As a result, testing data of "0000" appears at the parallel output port PO of the integrated circuit IC1. Because 4 bits of the second half of the data of "00001111" is only used for test transmitting to the shift registers BC1 to BC8, they are not used for testing, any other patterns can be also used.

In this state, when the chip selection terminal CSA of the external terminal unit 2 is set to "L" level, the integrated circuit IC1 is altered to the holding mode. In this holding mode, the state of the integrated circuit IC1 does not change and the parallel output port PO maintains the testing data of "0000".

Then, the chip selection terminal CSB of the external terminal unit 2 is set to "H" level to select the integrated circuit IC2. Furthermore, the integrated circuit IC2 is altered to the testing mode by setting the testing mode selection terminal TMS to "H" level.

Next, a command code (EXTEST) for inputting testing data is input into the serial input terminal SI of the integrated circuit IC2 which is now in the testing mode. As a result, the parallel input port PI of the integrated circuit IC2 gets the testing data of "0000" from the parallel output port PO of the integrated circuit IC1.

Then, suitable 8-bit data is input into the serial input terminal SI of the integrated circuit IC2, and this data is transferred to BC1 to BC8 based on the clock signal input into the clock terminal SCK. As a result of this, the testing data of "0000" gotten at the parallel input port PI of the integrated circuit IC2 is output from the serial output SO of the integrated circuit IC2, then the output data is compared with the testing data of "0000" which was input at the beginning into the serial input terminal SI of the integrated circuit IC1 in the checking apparatus 6.

Furthermore, the above operation in the testing mode is repeated for testing data of "1111". Thus, comparison can be made between the data output from the serial output terminal SO of the integrated circuit IC2 and the testing data of "0000" or "1111" input at the beginning into the integrated circuit IC1. If the comparison results shown any difference, then it means that there is some abnormality such as a connection failure in the corresponding signal line.

As described above, by transmitting or receiving testing data via the serial interface SIF of the integrated circuits IC1 and IC2 to be tested and by forcing each of the integrated circuits IC1 and IC2 to operate separately with the chip selection terminals CSA and CSB of the external terminal unit 2, the state of connection can be tested without further providing a testing interface TIF in addition to the serial interface SIF. Thus, simpler structure can be achieved in the integrated circuits IC1 and IC2.

As a result of usage of the structure described above, the serial interfaces SIF for serial communication of the integrated circuits IC1 and IC2 can be also used to test a state of operation of the integrated circuits IC1 and IC2 and to detect a failure of components or terminal connections, thus increase of extra testing terminals of the integrated circuit IC1 and IC2 can be limited to the least degree. Furthermore, the existing buses (such as a serial interface bus of a microcomputer) between integrated circuits can be used without any modification. This leads to simpler structure for testing connection failure and leads to reduction in the structure of connection. Moreover, it is possible to achieve an integrated circuit apparatus capable of testing a state of connection, with slight design modification using existing circuit patterns.

In the above embodiment, an example is shown in which the serial interfaces SIF for serial communication of the integrated circuits IC1 and IC2 are also used for testing. However, the present invention is not limited to this, and integrated circuits IC11 using a conventional B/S method (FIG. 5) can be combined.

Figure 9:
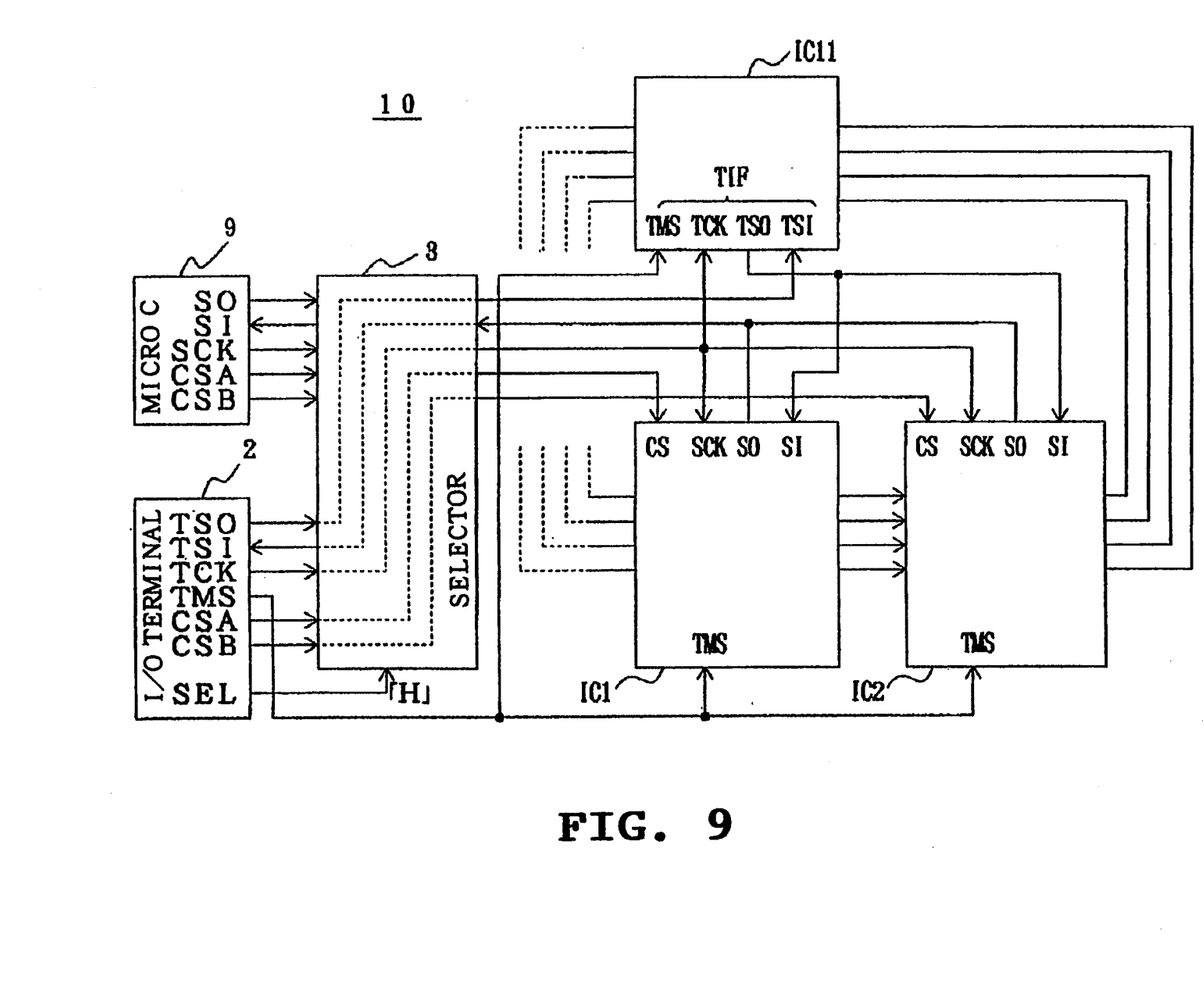
FIG. 9 is a block diagram showing structure of an integrated circuit apparatus according to another embodiment of the present invention.

That is, as shown in FIG. 9, in the case in which an integrated circuit IC11 (similar to the integrated circuit IC11 in FIG. 4) using a conventional B/S method is connected in addition to the integrated circuits IC1 and IC2, a testing interface TIF of the integrated circuit IC11 is connected to the common bus which is connected to the serial interface SIF of the integrated circuits IC1 and IC2 so that states of operation of integrated circuits IC1, IC2 and IC11 can be tested and component failure or terminal connection failure can be detected in a way similar to that described above.

In the above embodiment, by using the external terminal unit 2 and the selector 3, the external checking apparatus 6 controls integrated circuits IC1 or others to test them, however the present invention is not limited to this. The microcomputer 9 can be also used to transmit similar control signal so that self testing is achieved.

Figure 10:
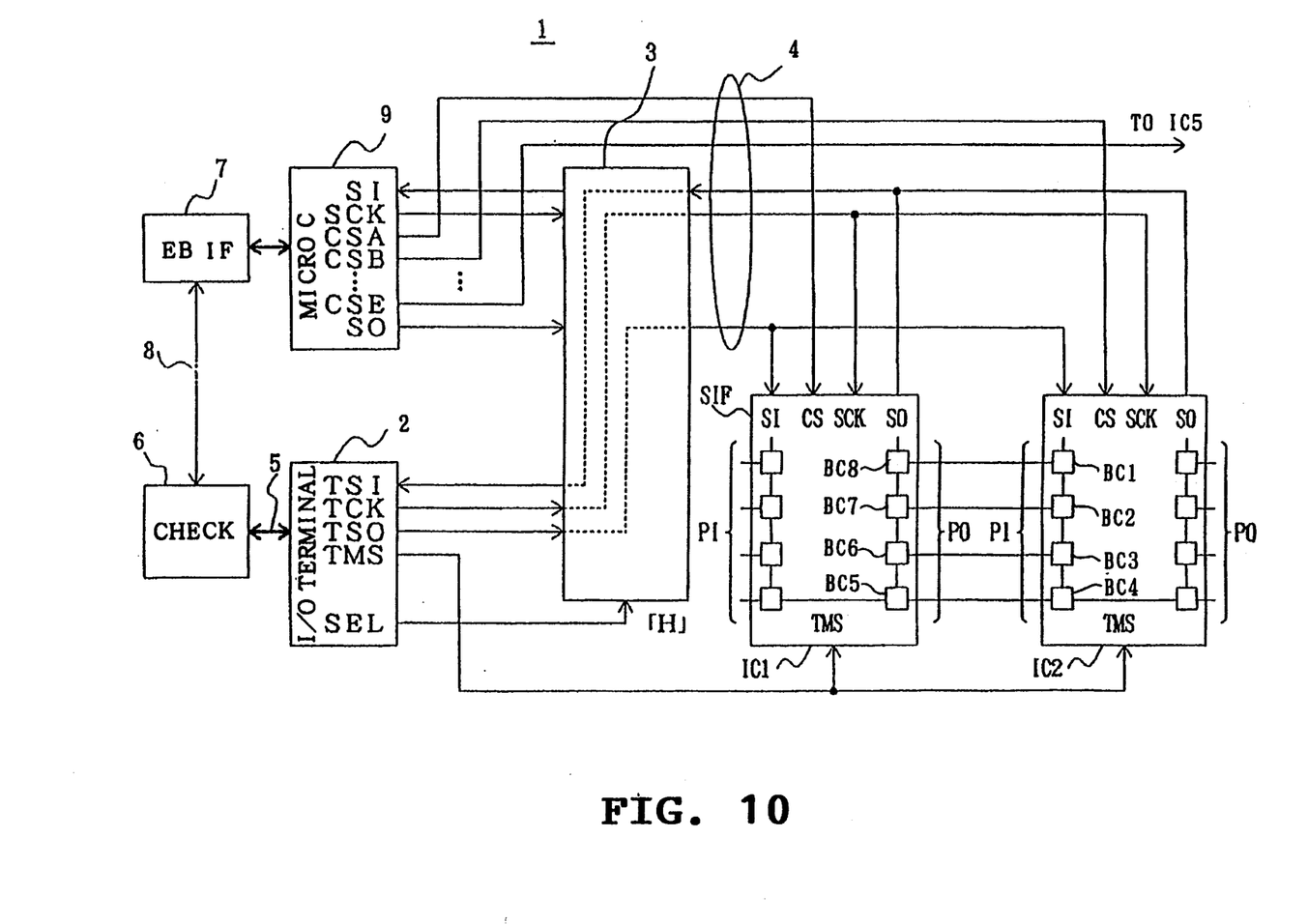
FIG. 10 is a block diagram showing structure of an integrated circuit apparatus according to the other embodiment of the present invention.

That is, FIG. 10 designates the other embodiment, in which a plurality of integrated circuits IC1 to IC5 are checked by the system according to the present invention. The chip select signals CSA to CSE for selecting plural integrated circuits is transmitted for control via the bus line 8, the bus interface 7 and the chip selection terminals of the microcomputer 9, not through from the check system 6 via the I/O terminal 4 to each integrated circuit.

As detailed described above, according to the second embodiment of the present invention, the microcomputer is constituted to output signal for selecting the integrated circuit, so that it becomes unnecessary to be the chip selection terminal in the external terminal portion. Thus, it can be realized a circuit board of an electric system with higher density and reliability.

The present invention is not limited only to the embodiment described above, but various modifications can be made based on the spirit of the present invention. It is accordingly not intended that such modifications are excluded from the scope of the invention. For example, the present invention can be applied to integrated circuits having terminals used for both inputting and outputting, or to integrated circuits having no parallel input ports.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. Apparatus for testing the interconnection of first and second integrated circuits including respective parallel data output and input terminals and serial input and output terminals, said first and second integrated circuits being controllable to perform serial to parallel and parallel to serial conversion of test data in a test mode, said serial input and output terminals being operable in said test mode to receive and supply test data and also operable in a non-test mode to receive and supply non-test serial data, and said parallel data output terminal of said first integrated circuit being connected to said parallel data input terminal of said second integrated circuit, the apparatus comprising:

means for setting said first and second integrated circuits in said test mode;

means for supplying predetermined test data to said serial input terminal of said first integrated circuit;

means for controlling said first integrated circuit to convert said predetermined test data to parallel data and to supply said parallel data as an output from said first integrated circuit at its parallel data output terminal;

means for controlling said second integrated circuit to read said parallel data supplied to its parallel data input terminal from said parallel data output terminal of said first integrated circuit, to convert said parallel data read by said second integrated circuit to serial data and to supply said serial data as an output from said second integrated circuit at its serial output terminal; and means for comparing said predetermined test data supplied to said serial input terminal of said first integrated circuit with said serial data supplied at said serial output terminal of said second integrated circuit.

2. The apparatus of claim 1, wherein said first integrated circuit includes boundary scan cells associated with its parallel data output terminal and said means for controlling said first integrated circuit controls said first integrated circuit to store in said boundary scan cells said predetermined data supplied to said serial input terminal of said first integrated circuit.

3. The apparatus of claim 1, wherein said second integrated circuit includes boundary scan cells associated with its parallel data input terminal and said means for controlling said second integrated circuit controls said second integrated circuit to store in said boundary scan cells said parallel data read by said second integrated circuit.

4. The apparatus of claim 1, wherein said first and second integrated circuits include respective chip selection terminals for enabling said first and second integrated circuits, and said apparatus further comprises means for providing an enable signal to said respective chip selection terminals of said first and second integrated circuits to enable said first and second integrated circuits.

5. The apparatus of claim 1, wherein said means for supplying test data is an I/O device coupled to said first integrated circuit.

6. The apparatus of claim 5, wherein said I/O device includes test serial output and input terminals for supplying said predetermined test data and for receiving said serial data, respectively, a test mode selection terminal for supplying a test mode selection signal to said first and second integrated circuits and chip selection terminals for supplying first and second chip selection signals to said first and second integrated circuits, respectively, said first and second integrated circuits being enabled when said respective first and second chip selection signals are supplied.

7. The apparatus of claim 6, further comprising means for de-coupling said I/O device from said first integrated circuit during said non-test mode.

8. The apparatus of claim 7, further comprising a microcomputer for controlling said first and second integrated circuits in said non-test mode, and wherein said means for decoupling includes means for coupling said microcomputer to said first and second integrated circuits in said non-test mode and for de-coupling said microcomputer from said first and second integrated circuits in said test mode.

9. The apparatus of claim 8, wherein said microcomputer includes serial output and input terminals for supplying and receiving serial data to and from said serial input and output terminals, respectively, of said first and second integrated circuits, and chip selection terminals for supplying said first and second chip selection signals to said first and second integrated circuits, respectively, in said non-test mode.

10. The apparatus of claim 8, wherein said first and second integrated circuits each include a clock terminal for receiving a clock signal, said I/O device includes a test clock output for supplying said clock signal to said first and second integrated circuits in said test mode, and said microcomputer includes a clock output for supplying said clock signal to said first and second integrated circuits in said non-test mode.

11. The apparatus of claim 1, wherein said first and second integrated circuits include respective chip selection terminals for enabling said first and second integrated circuits, and said apparatus further comprises a microcomputer having chip selection terminals for providing chip selection signals to said respective chip selection terminals of said first and second integrated circuits in said non-test mode and said test-mode.

12. The apparatus of claim 11, wherein said means for supplying test data is an I/O device having test serial output and input terminals for supplying said predetermined test data and for receiving said serial data, respectively, and a test mode selection terminal for supplying a test mode selection signal to said first and second integrated circuits.

13. The apparatus of claim 12, further comprising means for de-coupling said I/O device from said first integrated circuit in said non-test mode.

14. The apparatus of claim 13, wherein said microcomputer includes serial output and input terminals for supplying and receiving serial data to and from said serial input and output terminals, respectively, of said first and second integrated circuits in said non-test mode.

15. The apparatus of claim 14, wherein said means for de-coupling includes means for coupling said serial output and input terminals of said microcomputer to said first and second integrated circuits in said non-test mode and for de-coupling said serial output and input terminals of said microcomputer from said first and second integrated circuits in said test mode.

16. The apparatus of claim 15, wherein said first and second integrated circuits each include a clock terminal for receiving a clock signal, said I/O device includes a test clock output for supplying said clock signal to said first and second integrated circuits in said test mode, and said microcomputer includes a clock output for supplying said clock signal to said first and second integrated circuits in said non-test mode.

17. Method of testing the interconnection of first and second integrated circuits including respective parallel data output and input terminals and serial input and output terminals, said first and second integrated circuits being controllable to perform serial to parallel and parallel to serial conversion of test data in a test mode, said serial input and output terminals being operable in said test mode to receive and supply test data and also operable in a non-test mode to receive and supply non-test serial data, and said parallel data output terminal of said first integrated circuit being connected to said parallel data input terminal of said second integrated circuit, the method comprising the steps of:
    setting said first and second integrated circuits in said test mode;
    supplying predetermined test data to said serial input terminal of said first integrated circuit;
    controlling said first integrated circuit to convert said predetermined test data to parallel data and to supply said parallel data as an output from said first integrated circuit at its parallel data output terminal;
    controlling said second integrated circuit to read said parallel data supplied to its parallel data input terminal from said parallel data output terminal of said first integrated circuit, to convert said parallel data read by said second integrated circuit to serial data and to supply said serial data as an output from said second integrated circuit at its serial output terminal; and
    comparing said predetermined test data supplied to said serial input terminal of said first integrated circuit with said serial data supplied at said serial output terminal of said second integrated circuit.

18. The method of claim 17, wherein said first integrated circuit includes boundary scan cells associated with its parallel data output terminal and said step of controlling said first integrated circuit is accomplished by controlling said first integrated circuit to store in said boundary scan cells said predetermined data supplied to said serial input terminal of said first integrated circuit.

19. The method of claim 17, wherein said second integrated circuit includes boundary scan cells associated with its parallel data input terminal and said step of controlling said second integrated circuit is accomplished by controlling said second integrated circuit to store in said boundary scan cells said parallel data read by said second integrated circuit.

20. The method of claim 17, wherein said first and second integrated circuits include respective chip selection terminals for enabling said first and second integrated circuits, and said method further comprises the step of providing an enable signal to said respective chip selection terminals of said first and second integrated circuits.

* * * * *